(12) United States Patent
Koya (10) Patent No.: US 11,728,555 B2
(45) Date of Patent: Aug. 15, 2023

(54) RECTANGULAR WAVEGUIDE COMMUNICATION BETWEEN MEMORY AND PROCESSOR

(71) Applicant: Micron Technology, Inc., Boise, ID (US)

(72) Inventor: Yoshihito Koya, Kamakura (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/461,539

(22) Filed: Aug. 30, 2021

(65) Prior Publication Data

US 2021/0391634 A1    Dec. 16, 2021

Related U.S. Application Data

(62) Division of application No. 16/141,797, filed on Sep. 25, 2018, now Pat. No. 11,108,127.

(51) Int. Cl.
| | |
|---|---|
| *G06F 3/12* | (2006.01) |
| *H01P 3/12* | (2006.01) |
| *H01P 1/24* | (2006.01) |
| *H05K 1/18* | (2006.01) |
| *H05K 1/02* | (2006.01) |
| *G06F 13/16* | (2006.01) |
| *G06F 13/40* | (2006.01) |
| *H01P 5/08* | (2006.01) |

(52) U.S. Cl.
CPC ............ *H01P 3/12* (2013.01); *G06F 13/1668* (2013.01); *G06F 13/4068* (2013.01); *H01P 1/24* (2013.01); *H05K 1/0243* (2013.01); *H05K 1/181* (2013.01); *H01P 5/085* (2013.01); *H05K 2201/10159* (2013.01); *H05K 2201/10257* (2013.01); *H05K 2201/10515* (2013.01); *H05K 2201/10522* (2013.01)

(58) Field of Classification Search
None
See application file for complete search history.

(56) References Cited

U.S. PATENT DOCUMENTS

| | | | |
|---|---|---|---|
| 2010/0144159 A1* | 6/2010 | Takatsuki | H01L 21/31662 438/758 |
| 2012/0166582 A1 | 6/2012 | Binder | |
| 2015/0215042 A1 | 7/2015 | Guidotti et al. | |
| 2017/0059356 A1* | 3/2017 | Kallman | H01P 3/16 |

* cited by examiner

*Primary Examiner* — Scott C Sun
(74) *Attorney, Agent, or Firm* — Dorsey & Whitney LLP (57) ABSTRACT

Disclosed herein is an apparatus that includes a memory, a processor, and a rectangular waveguide coupled to the memory and the processor so that the memory and the processor communicate with each other via the rectangular waveguide.

8 Claims, 9 Drawing Sheets

RECTANGULAR WAVEGUIDE COMMUNICATION BETWEEN MEMORY AND PROCESSOR

CROSS-REFERENCE TO RELATED APPLICATION

This application is a Divisional of U.S. patent application Ser. No. 16/141,797, filed Sep. 25, 2018, issued as U.S. Pat. No. 11,108,127 on Aug. 31, 2021. This application and patent are incorporated by reference herein in their entirety and for all purposes.

BACKGROUND

In order to increase the data transfer rate between a DRAM (Dynamic Random-Access Memory) memory device and a processor such as a CPU (Central Processing Unit) or a GPU (Graphic Processing Unit), there is a known technique of stacking these units one on top of the other to be connected directly via many bump electrodes, without connecting these units with a copper wire on a motherboard. This technique is directed, for example, to transfer many pieces of data in parallel at one time and realize a high data transfer rate.

However, the DRAM memory device and the processor both generate a large amount of heat in association with the operations. Therefore, when these units are stacked, there is a concern that the heat releasing performance is reduced and the chip temperature is greatly increased. Further, this configuration also reduces the flexibility in the layout because the DRAM memory device and the processor are not placed on different planar positions.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Transmission and reception of a signal between semiconductor chips mounted on a motherboard is performed using a copper wire. However, the copper wire substantially functions as a low-pass filter because a parasitic capacitance component is added in parallel thereto. Therefore, when the frequency of a signal to be transmitted becomes high, the signal component is greatly attenuated. In contrast thereto, in the present embodiment, transmission of a signal is performed using a rectangular waveguide. The rectangular waveguide substantially functions as a high-pass filter. Accordingly, it is possible to perform signal transmission using the rectangular waveguide at a high speed by increasing the frequency of a signal to be transmitted or received to, for example, 100 GHz or higher.

Figure 1:
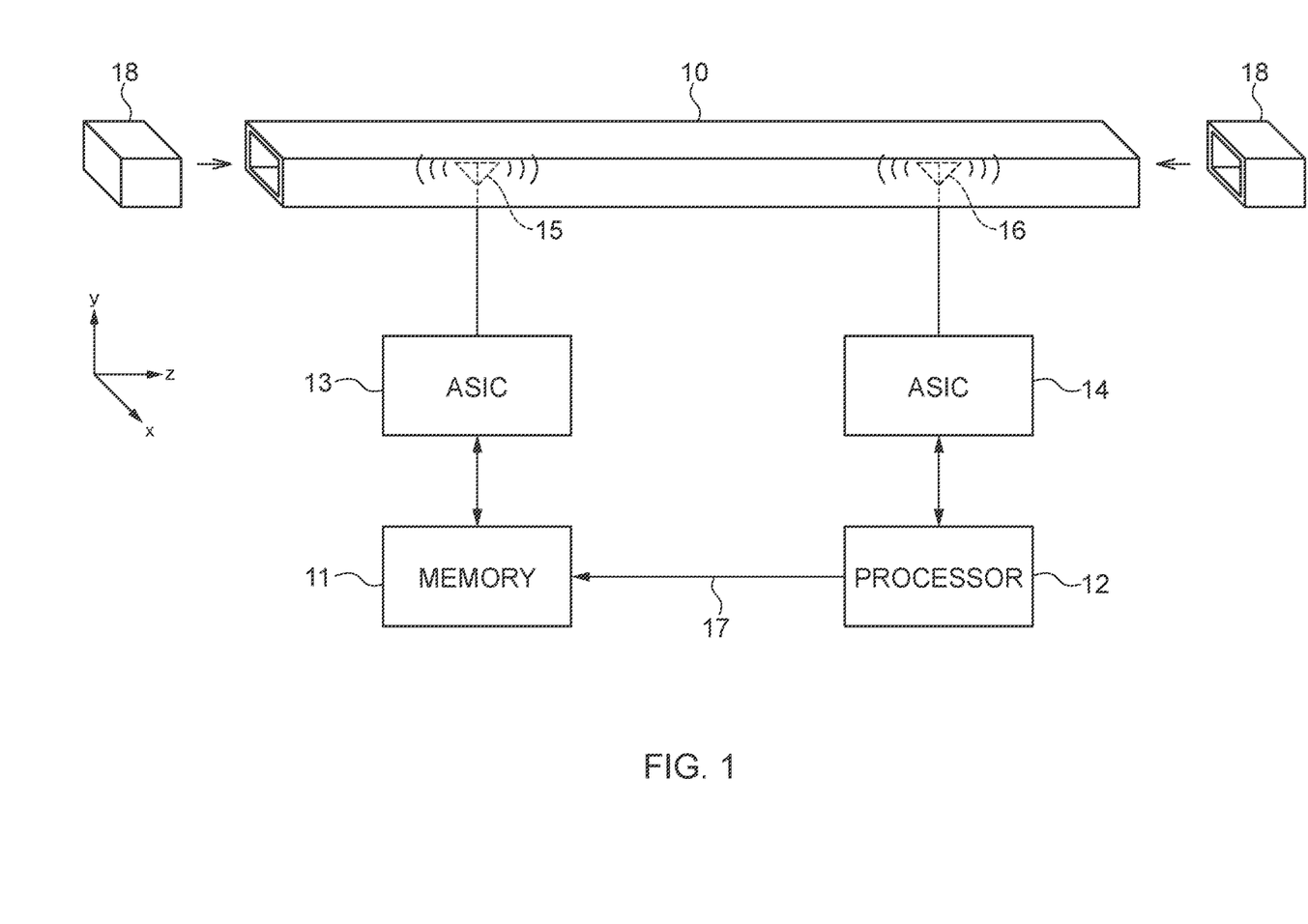
FIG. 1 is a simplified schematic diagram showing an exemplary configuration of a communication system according to an embodiment.

An apparatus shown in FIG. 1 includes a system (e.g., communication system) having a rectangular waveguide 10, a memory 11, and a processor 12. The memory 11 is a memory device and is, for example, a DRAM, a synchronous dynamic random-access memory (SDRAM), a flash memory, a read-only memory (ROM), an electrically erasable programmable ROM (EEPROM), a static RAM (SRAM), an erasable programmable ROM (EPROM), or a resistance variable memory such as a phase-change random-access memory (PCRAM), a resistive random-access memory (RRAM), and a magnetoresistive random-access memory (MRAM). The processor 12 is, for example, a CPU. The memory 11 is connected to an antenna 15 via an ASIC (Application Specific Integrated Circuit) 13. The processor 12 is connected to an antenna 16 via an ASIC 14. The rectangular waveguide 10 is a metallic pipe that is rectangular in an xy-section and extends in a z direction. The antennas 15 and 16 are placed in a hollow of the rectangular waveguide 10. The position of the antenna 15 in the z direction and the position of the antenna 16 in the z direction are different from each other, and the antennas 15 and 16 transmit or receive a signal each other via an electromagnetic wave transmitting through the hollow of the rectangular waveguide 10. The antenna 15 transmits read data output from the memory 11 and receives write data output from the processor 12. The antenna 16 transmits write data output from the processor 12 and receives read data output from the memory 11. Information transmitted or received via the rectangular waveguide 10 is not only read data and write data but can be also any other information. For example, command address information, control data, or the like can be transmitted or received via the rectangular waveguide 10.

The rectangular waveguide 10 can transmit a high-frequency signal equal to or higher than 100 GHz with low loss and high quality, differently from a general copper wire. Therefore, when the memory 11 and the processor 12 are connected with the rectangular waveguide 10, a data transfer rate therebetween can be ensured without stacking of the memory 11 and the processor 12 one on top of the other. This enables the memory 11 and the processor 12 to be placed at different planar positions from each other on a motherboard, so that the heat releasing performance is enhanced and the flexibility of the layout is also increased. Further, a signal transmitted by the rectangular waveguide 10 has an advantage of being unlikely to be affected by exogenous noise because this signal travels through the hollow of the metallic pipe. When waveguide terminators 18 are connected at ends of the rectangular waveguide 10 in the z direction, respectively, exogenous noise entering from the ends of the rectangular waveguide 10 can be blocked and an electromagnetic wave leaking from the ends of the rectangular waveguide 10 can be also blocked.

A signal transmitted via the rectangular waveguide 10 can be read data read from the memory 11 or write data to be written to the memory 11, or can be a command, an address, or other control signals to be supplied to the memory 11 from the processor 12. Some signals such as a clock signal can be supplied from the processor 12 to the memory 11 via a copper wire 17 provided separately from the rectangular waveguide 10. Transmission of read data, write data, a command, and an address can be performed in a time-division manner.

Figure 2A:
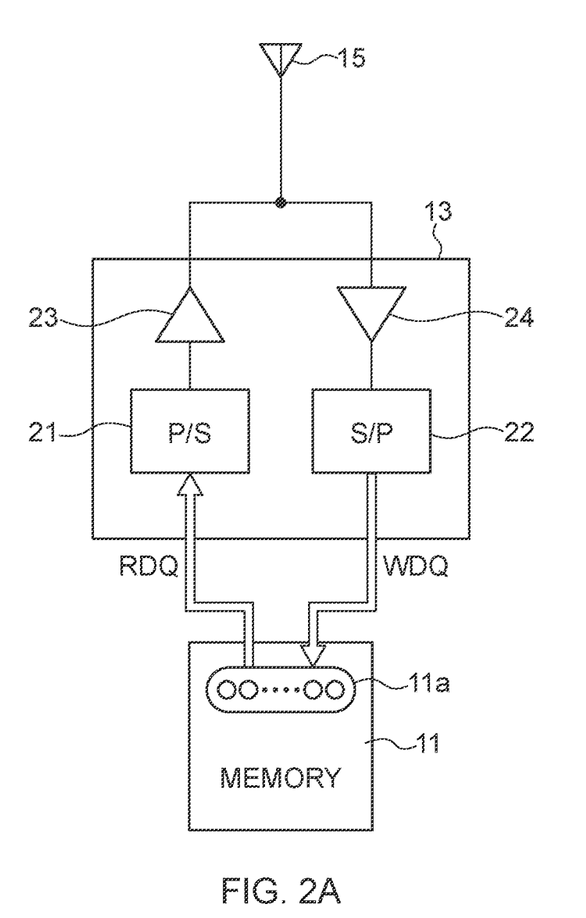
FIGS. 2A and 2B are block diagrams showing an exemplary configuration of an ASIC shown in FIG. 1.

As shown in FIG. 2A, the ASIC 13 includes a parallel/serial converter 21 that converts parallel read data RDQ into serial read data, and a serial/parallel converter 22 that converts serial write data WDQ into parallel write data. The numbers of bits in the parallel read data RDQ and the parallel write data WDQ are, for example, 1 kilobit or more. An input side of the parallel/serial converter 21 and an output side of the serial/parallel converter 22 are connected in parallel to a plurality of I/O terminals 11a provided on the memory 11. In some embodiments, a high switching speed according to the frequency of a signal transmitted via the rectangular waveguide 10, for example, a switching speed equal to or higher than 100 GHz is required for a buffer circuit 23 connected to an output side of the parallel/serial converter 21 and a receiver circuit 24 connected to an input side of the serial/parallel converter 22. A transistor that enables such high speed switching may be difficult to integrate in a same semiconductor chip as the memory 11. In some embodiments, when the memory 11 and the ASIC 13 are integrated in semiconductor chips different from each other, the serial read data RDQ and the serial write data WDQ can be transmitted or received using the ASIC 13.

Figure 2B:
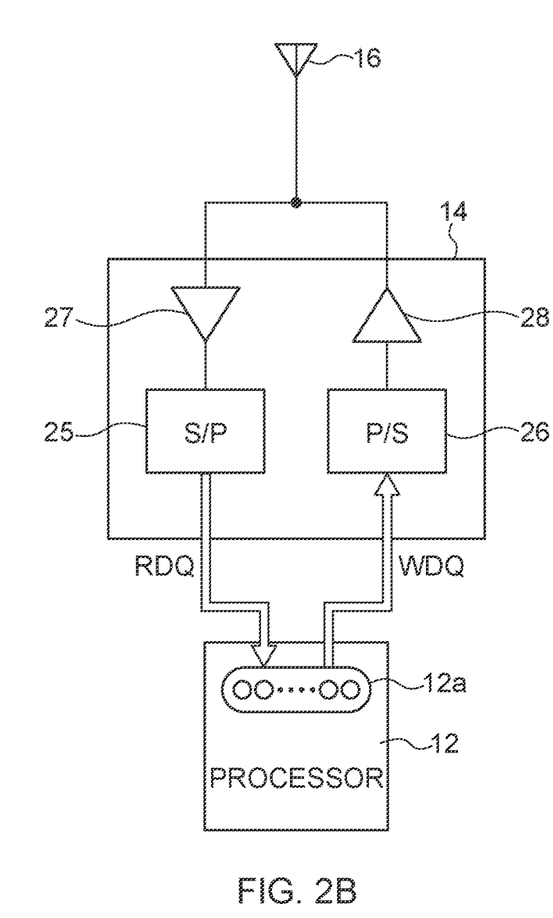

As shown in FIG. 2B, the ASIC 14 includes a serial/parallel converter 25 that converts serial read data RDQ into parallel read data, and a parallel/serial converter 26 that converts parallel write data WDQ into serial write data. An output side of the serial/parallel converter 25 and an input side of the parallel/serial converter 26 are connected in parallel to a plurality of I/O terminals 12a provided on the processor 12. In some embodiments, a high switching speed according to the frequency of a signal transmitted via the rectangular waveguide 10 is required for a receiver circuit 27 connected on an input side of the serial/parallel converter 25 and a buffer circuit 28 connected on an output side of the parallel/serial converter 26. A transistor that enables such high speed switching may be difficult to integrate in a same semiconductor chip as the processor 12 such as a CPU. In some embodiments, when the processor 12 and the ASIC 14 are integrated in semiconductor chips different from each other, the serial read data RDQ and the serial write data WDQ can be transmitted or received using the ASIC 14.

Figure 3:
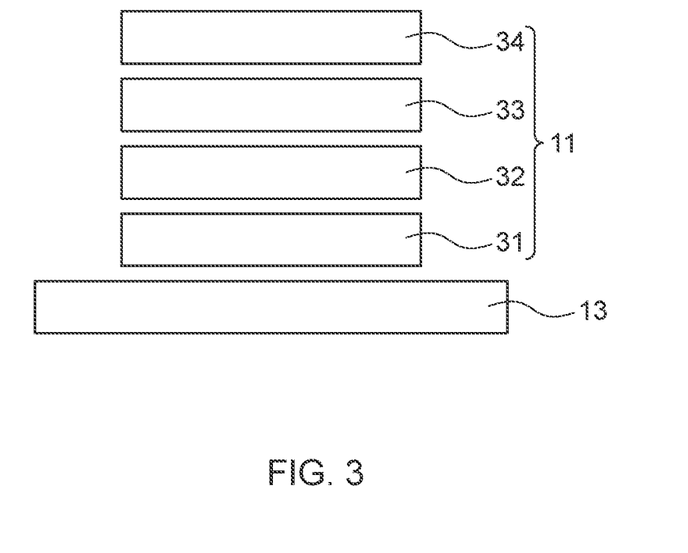
FIG. 3 is a simplified schematic diagram showing an example in which a plurality of memory chips and an ASIC chip are stacked according to an embodiment.

The memory 11 can be constituted of a single memory chip or can include a plurality of memory chips stacked one on top of the other. Further, a plurality of memory chips 31 to 34 and the ASIC 13 can be stacked as shown in FIG. 3. Although not shown, the processor 12 and the ASIC 14 can be stacked one on top of the other, or can be single chip.

Figure 4:
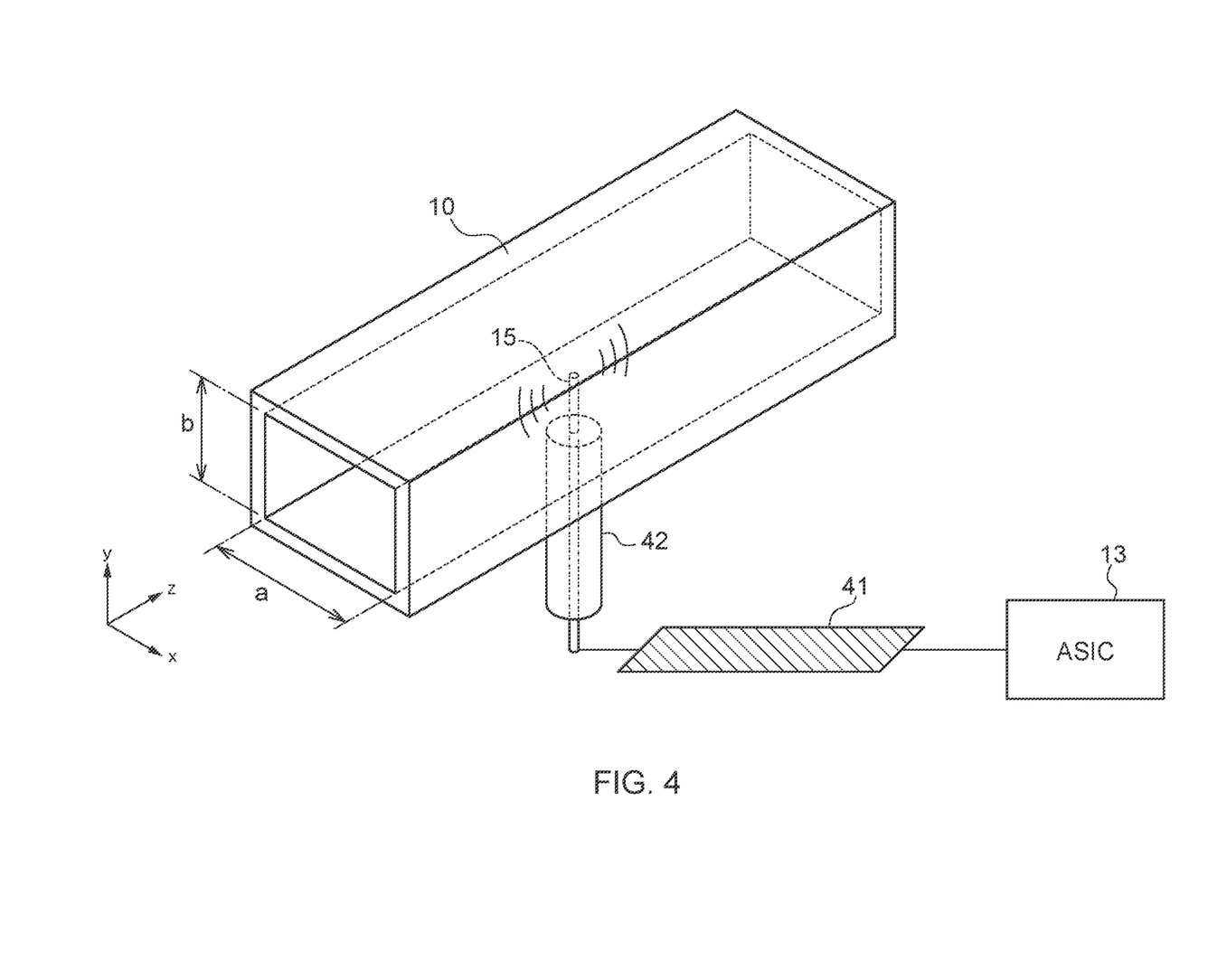
FIG. 4 is a simplified schematic diagram showing an example in which a rectangular waveguide and an ASIC are connected via a microstrip line and a coaxial line.

The ASIC 13 and the antenna 15 can be connected via a microstrip line 41 and a coaxial line 42 as shown in FIG. 4. The microstrip line 41 is a transmission line including a conductor pattern placed on a ground pattern with a dielectric layer interposed therebetween. An electromagnetic wave transmitted via the microstrip line 41 and the coaxial line 42 can be that in a TEM (Transverse ElectroMagnetic) mode. However, because the rectangular waveguide 10 cannot transmit an electromagnetic wave in a TEM mode in which the electromagnetic field has no z-direction component, a signal in the TEM mode is converted to a signal in a TE (Transverse Electric) mode or a TM (Transverse Magnetic) mode via the antenna 15. As shown in FIG. 4, the antenna 15 can have a central conductor, which constitutes the coaxial line 42, protruded into the hollow of the rectangular waveguide 10.

When the inside diameter of the rectangular waveguide 10 in the x direction is "a" and the inside diameter thereof in the y direction is b, a cutoff wavelength λc in a TEm,n mode is represented by the following expression.

$$\lambda_c = \frac{2}{\sqrt{\left(\frac{m}{a}\right)^2 + \left(\frac{n}{b}\right)^2}}$$

As an example, when a=6 millimeters and b=3 millimeters, the cutoff wavelength λc in a TE10 mode is 1.2 centimeters and the cutoff frequency fc is 250 GHz. The cutoff frequency fc in a TE01 mode is 500 GHz. Therefore, in order to perform transmission in the TE10 mode using the rectangular waveguide 10 where a millimeters and b=3 millimeters, an electromagnetic wave higher than 250 GHz and lower than 500 GHz needs to be transmitted or received via the antennas 15 and 16. This means that an operating frequency higher than 250 GHz and lower than 500 GHz is required as the operating frequency of the ASICs 13 and 14.

Figure 5:
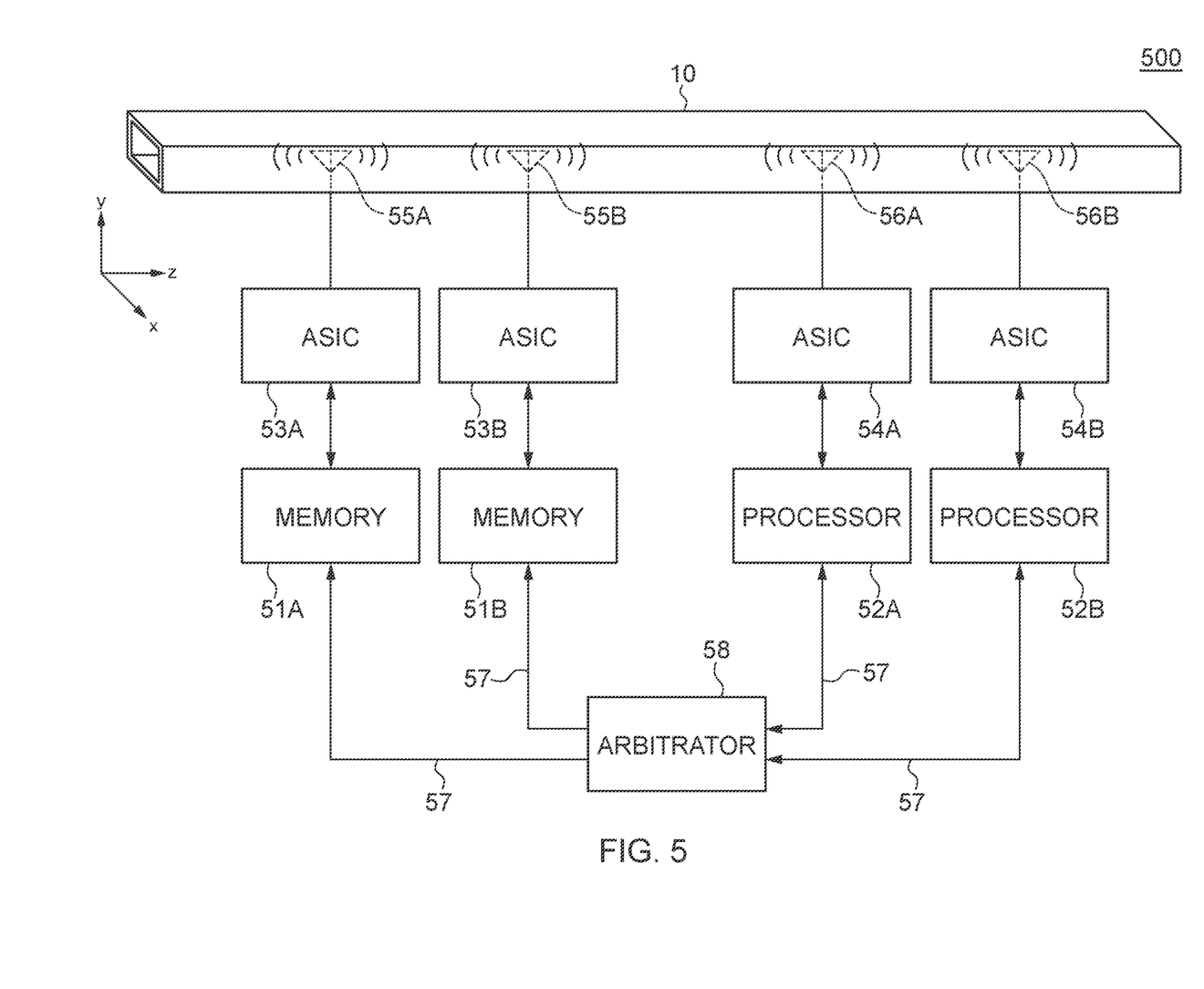
FIG. 5 is a simplified schematic diagram showing an exemplary configuration of a communication system according to an embodiment.

In a system 500 shown in FIG. 5, a first unit including a memory 51A and a processor 52A and a second unit including a memory 51B and a processor 52B are connected to the rectangular waveguide 10. The memories 51A and 51B are connected to antennas 55A and 55B via ASICs 53A and 53B, respectively. The processors 52A and 52B are connected to antennas 56A and 56B via ASICs 54A and 54B, respectively. In this way, a plurality of units each including a memory and a processor can be connected to the rectangular waveguide 10.

The first unit and the second unit can prevent mutual interference by transmitting and receiving signals in a time-division manner. An arbitrator 58 controls operation timings of the first unit and the second unit. The mutual interference is prevented by supply of a clock signal or a sideband signal from the arbitrator 58 to the memories 51A and 51B and the processor 52A and 52B via a copper wire 57.

Figure 6:
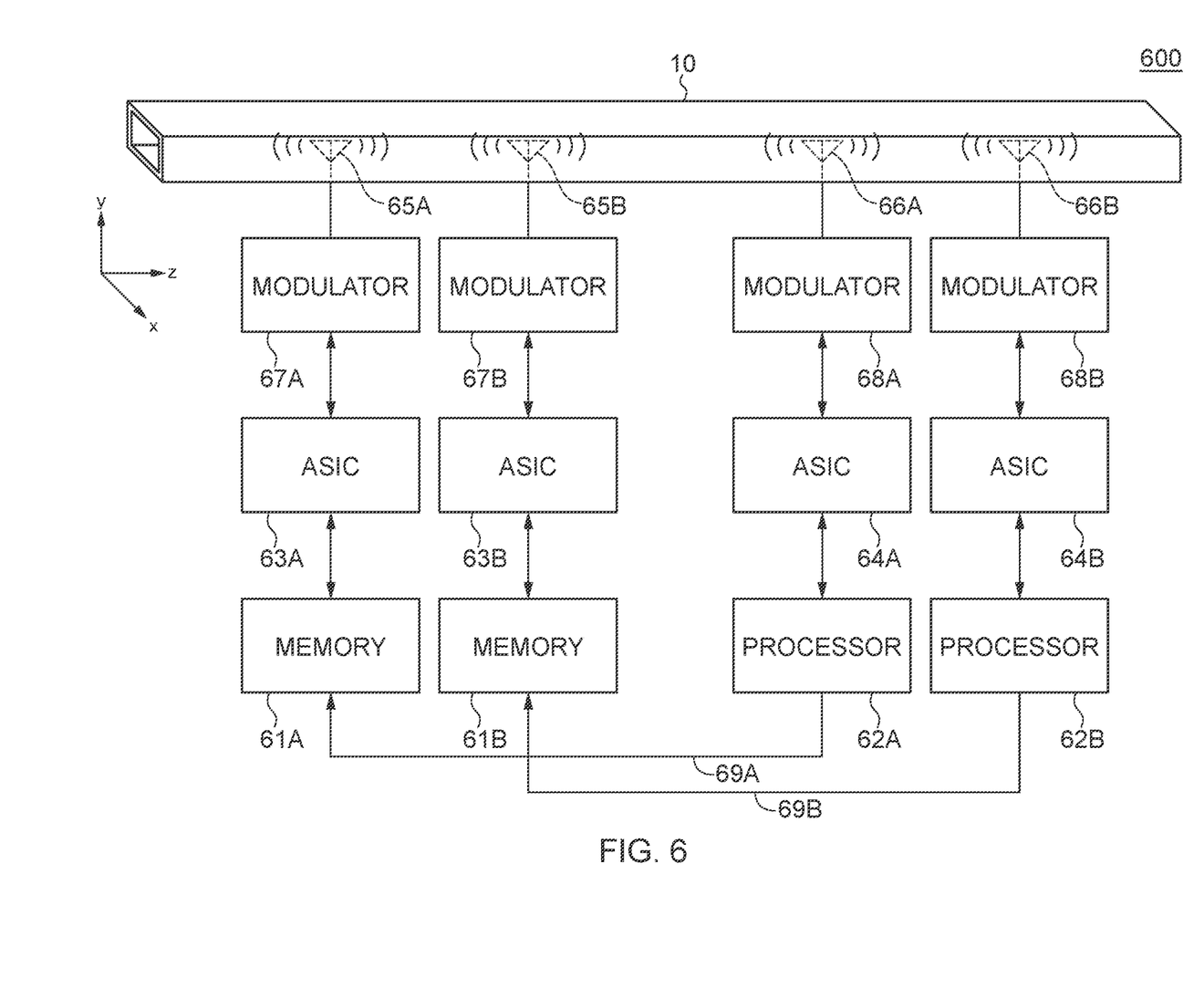
FIG. 6 is a simplified schematic diagram showing an exemplary configuration of a communication system according to an embodiment.

In a system 600 shown in FIG. 6, the rectangular waveguide 10 is connected to a first unit including a memory 61A and a processor 62A and a second unit including a memory 61B and a processor 62B. The system 600 does not include the arbitrator 58 shown in FIG. 5. The system 600 is different from the system 500 and is an example including modulators 67A, 67B, 68A, and 68B.

The memory 61A is connected to an antenna 65A via an ASIC 63A and the modulator 67A. The memory 61B is connected to an antenna 65B via an ASIC 63B and the modulator 67B. The processor 62A is connected to an antenna 66A via an ASIC MA and the modulator 68A. The processor 62B is connected to an antenna 66B via an ASIC MB and the modulator 68B.

The modulators 67A, 67B, 68A, and 68B modulate signals to be transmitted or received via the antennas 65A, 65B, 66A, and 66B, respectively. The modulation method is not particularly limited and an FDMA (Frequency-Division Multiple Access) method, a CDMA (Code-Division Multiple Access) method, an OFDMA (Orthogonal Frequency-Division Multiple Access) method, or the like can be used. This enables signal transmission of the first unit using the antennas 65A and 66A and signal transmission of the second unit using the antennas 65B and 66B to be performed simultaneously without mutual interference. Further, because the first unit and the second unit can be operated asynchronously, the arbitrator can be omitted. In this case, some signals such as a clock signal can be supplied from the processor 62A to the memory 61A via a copper wire 69A and can be supplied from the processor 62B to the memory 61B via a copper wire 69B.

Figure 7:
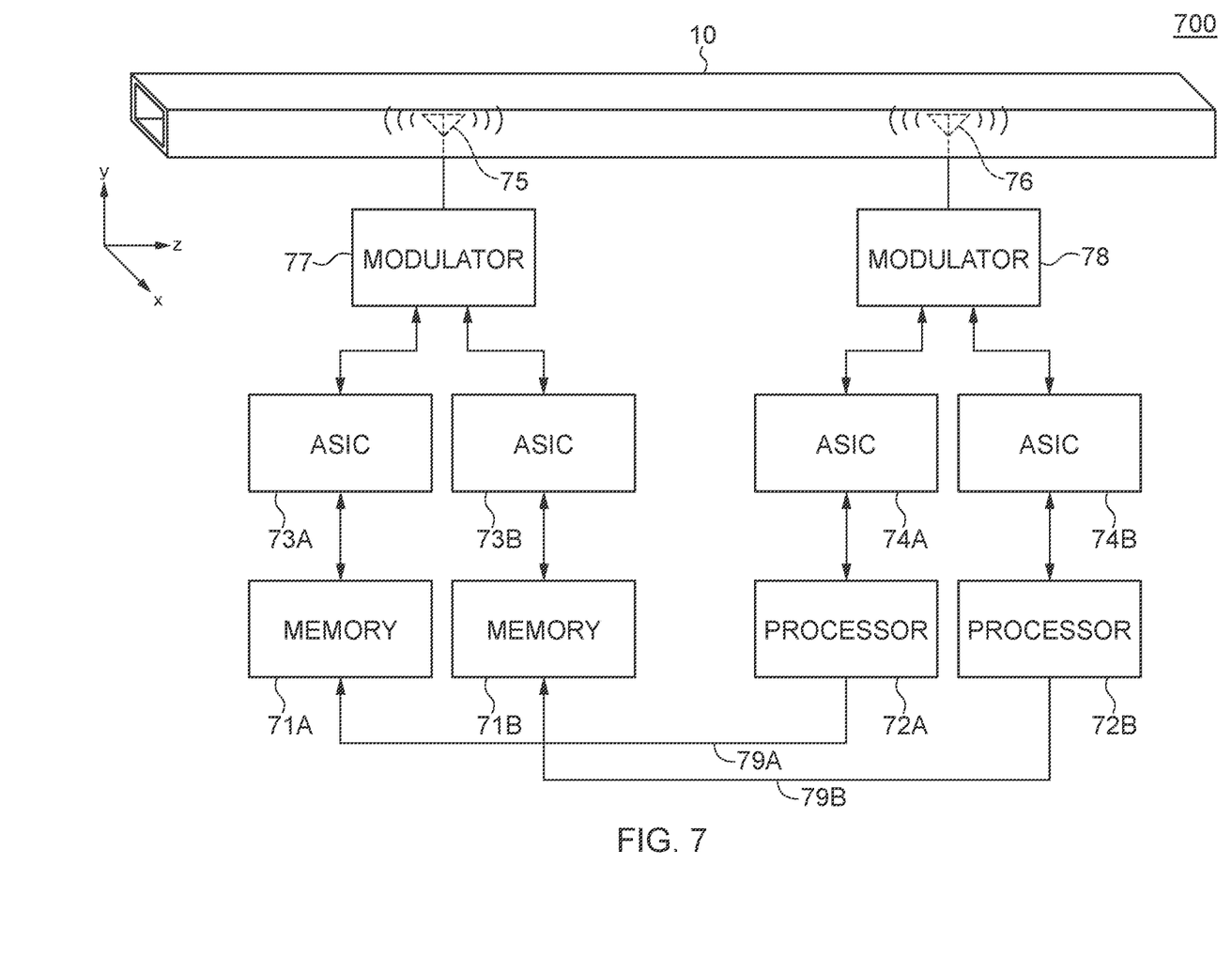
FIG. 7 is a simplified schematic diagram showing an exemplary configuration of a communication system according to an embodiment.

In a system 700 shown in FIG. 7, the rectangular waveguide 10 is connected to a first unit including a memory 71A and a processor 72A and a second unit including a memory 71B and a processor 72B. The system 700 is different from the system 600 in a configuration related to antennas and modulators.

The memory 71A is connected to an antenna 75 via an ASIC 73A and a modulator 77. The memory 71B is connected to the antenna 75 via an ASIC 73B and the modulator 77. The processor 72A is connected to an antenna 76 via an ASIC 74A and a modulator 78. The processor 72B is connected to the antenna 76 via an ASIC 74B and the modulator 78. The processor 72A and the memory 71A are connected with a copper wire 79A and the processor 72B and the memory 71B are connected with a copper wire 79B.

The system 700 shown in FIG. 7 includes the modulators 77 and 78. The modulator 77 and the antenna 75 are shared by the two memories 71A and 71B and the modulator 78 and the antenna 76 are shared by the two processors 72A and 72B. When a signal of the first unit and a signal of the second unit can be separated by modulation in this way, a plurality of units can share a modulator and an antenna.

Figure 8:
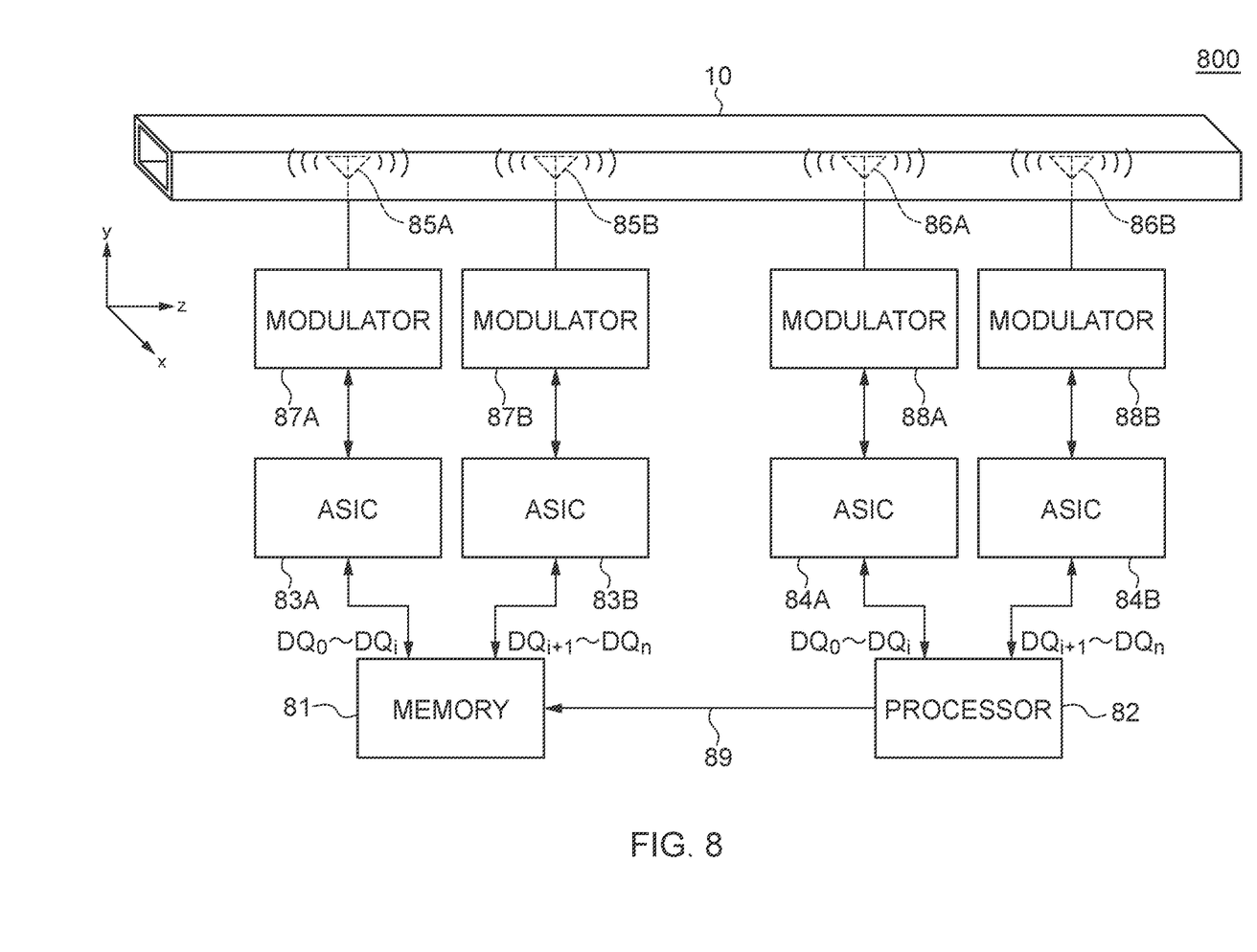
FIG. 8 is a simplified schematic diagram showing an exemplary configuration of a communication system according to an embodiment.

In a system 800 shown in FIG. 8, a memory 81 and a processor 82 are connected to the rectangular waveguide 10. The system 800 is different from the system 600 in a configuration related to the memory 81 and the processor 82.

The memory 81 has a path connected to an antenna 85A via an ASIC 83A and a modulator 87A and a path connected to an antenna 85B via an ASIC 83B and a modulator 87B. The processor 82 has a path connected to an antenna 86A via an ASIC 84A and a modulator 88A and a path connected to an antenna 86B via an ASIC 84B and a modulator 88B. The processor 82 and the memory 81 are connected with a copper wire 89.

In the system 800 shown in FIG. 8, data DQ0 to DQi corresponding to half of n+1 bits of data to be transmitted in parallel travel through one of the paths and data DQi+1 to DQn corresponding to the other half travel through the other path. Accordingly, the numbers of I/O bits of the ASICs 83A, 83B, 84A and 84B (the numbers of bits of data transmitted or received at one time) are all (n+1)/2 bits. Therefore, when the numbers of I/O bits of the ASICs 83A, 83B, 84A, and 84B and the operating frequencies thereof are the same as those in the system shown in FIG. 1, the data transfer rate via the rectangular waveguide 10 can be doubled by designing the numbers of I/O bits of the memory 81 and the processor 82 to be twice as that of the system shown in FIG. 1. Alternatively, when the data transfer rate via the rectangular waveguide 10 is the same as that of the system shown in FIG. 1 and the numbers of I/O bits of the memory 81 and the processor 82 are the same as those in the system shown in FIG. 1, the operating frequencies of the ASICs 83A, 83B, 84A, and 84B can be reduced to ½.

Figure 9:
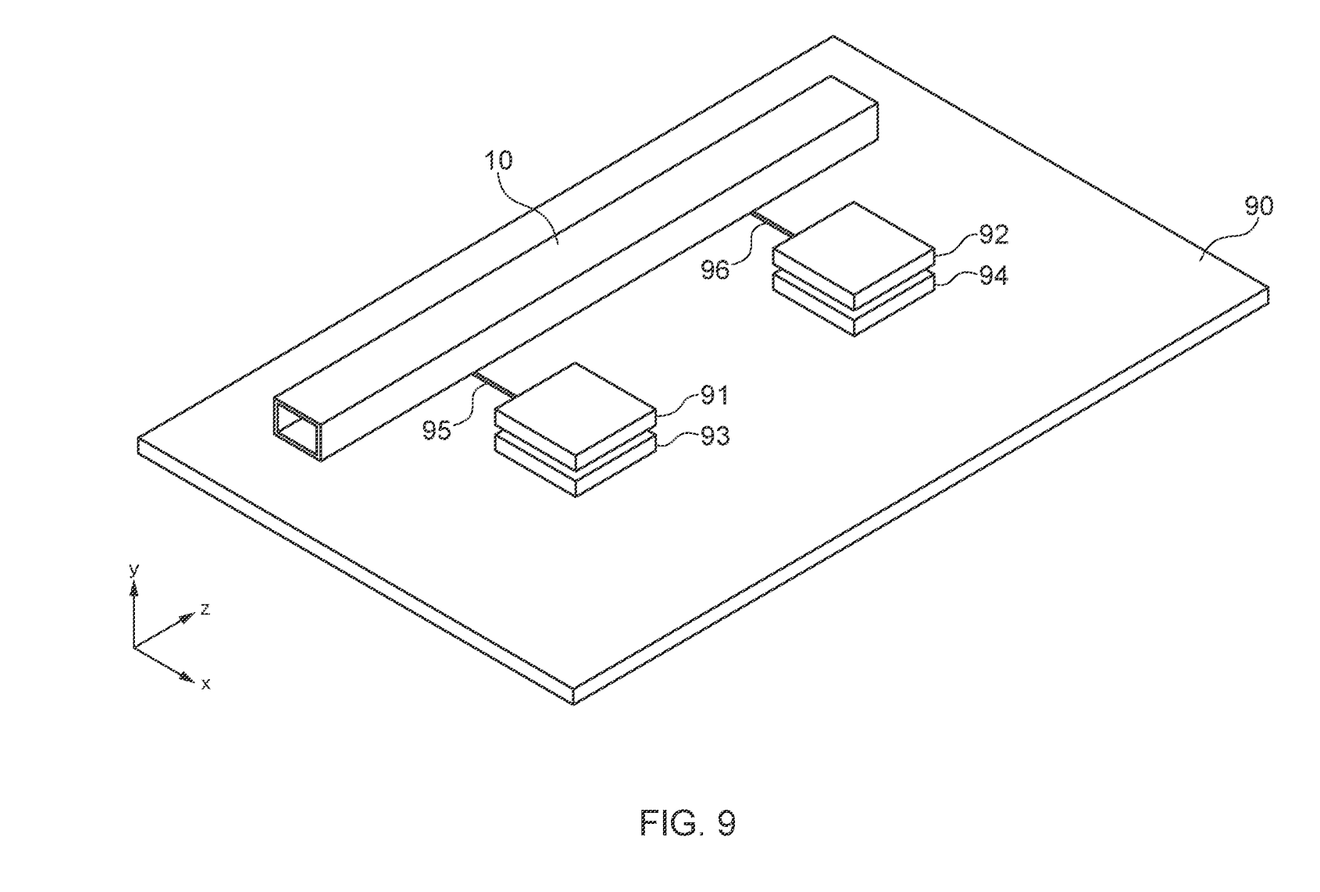
FIG. 9 is a simplified schematic diagram showing an exemplary configuration of a communication system according to an embodiment.

FIG. 9 shows an example of a system having the rectangular waveguide 10 mounted on a motherboard 90. As shown in FIG. 9, the rectangular waveguide 10 is mounted on the motherboard 90 having an xz plane as the principal surface, whereby the rectangular waveguide 10 can be supported stably. In the example shown in FIG. 9, a memory 91 and an ASIC 93 are stacked one on top of the other and are connected to a predetermined position of the rectangular waveguide 10 via a microstrip line 95. Further, a processor 92 and an ASIC 94 are stacked one on top of the other and are connected to a predetermined position of the rectangular waveguide 10 via a microstrip line 96. When the memory 91 and the processor 92 are connected in this way using the rectangular waveguide 10, the memory 91 and the processor 92 can be mounted at arbitrary positions on the motherboard 90. The rectangular waveguide 10 can be made by folding a metallic plate or can be made directly on the motherboard 90 using a 3D printer.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a rectangular waveguide having first and second antennas provided inside a hollow of the rectangular waveguide;
   a memory having a plurality of data I/o terminals;
   a processor having a plurality of data I/O terminals;
   a first circuit coupled between the data I/O terminals of the memory and the first antenna of the rectangular waveguide; and
   a second circuit coupled between the data terminals of the processor and the second antenna of the rectangular waveguide.

2. The apparatus of claim 1, further comprising:
   a first transmission line coupled between the first circuit and the first antenna of the rectangular waveguide; and
   a second transmission line coupled between the second circuit and the second antenna of the rectangular waveguide,
   wherein the first and second transmission lines transmits a signal in a TEM mode.

3. The apparatus of claim 2, wherein each of the first and second transmission lines includes a microstrip line or a coaxial line.

4. The apparatus of claim 2, wherein each of the first and second antennas is configured to convert a signal between a TEM mode and a TE mode or TM mode.

5. The apparatus of claim 1, further comprising a waveguide terminator provided at an end of the rectangular waveguide.

6. The apparatus of claim 1, wherein the first circuit is configured to serially receive data provided by the memory and modulate signals to be transmitted via the first antenna, and wherein the second circuit is configured to modulate signals received via the second antenna.

7. The apparatus of claim 1, wherein the rectangular waveguide has a third antenna, and the apparatus further comprises:
 a second memory having a plurality of data I/O terminals; and
 a third circuit coupled between the data I/O terminals of the second memory and the third antenna of the rectangular waveguide.

8. The apparatus of claim 1 wherein the memory has a second plurality of data I/O terminals and the rectangular waveguide has a third antenna, and the apparatus further comprises a third circuit coupled between the second plurality of data I/O terminals and the third antenna of the rectangular waveguide.

* * * * *

UNITED STATES PATENT AND TRADEMARK OFFICE
CERTIFICATE OF CORRECTION

PATENT NO. : 11,728,555 B2
APPLICATION NO. : 17/461539
DATED : August 15, 2023
INVENTOR(S) : Yoshihito Koya It is certified that error appears in the above-identified patent and that said Letters Patent is hereby corrected as shown below:

In the Claims

| | Reads | Should Read |
|---|---|---|
| Column 6, Line 49 | "a memory having a plurality of data I/o terminals;" | -- a memory having a plurality of data I/O terminals; -- |
| Column 6, Line 54 | "a second circuit coupled between the data terminals" | -- a second circuit coupled between the data I/O terminals -- |

Signed and Sealed this
Fourteenth Day of November, 2023

Katherine Kelly Vidal
*Director of the United States Patent and Trademark Office*